United States Patent
Lee et al.

(10) Patent No.: US 9,583,294 B2
(45) Date of Patent: Feb. 28, 2017

(54) MEMS SWTICH WITH INTERNAL CONDUCTIVE PATH

(71) Applicant: Analog Devices Global, Hamilton (BM)

(72) Inventors: Check F. Lee, Bedford, MA (US); Raymond C. Goggin, Watergrasshill (IE); Padraig L. Fitzgerald, Mallow (IE); Bernard P. Stenson, Manister (IE); Mark Schirmer, Stoughton, MA (US); Jo-ey Wong, Wayland, MA (US)

(73) Assignee: Analog Devices Global, Hamilton (BM)

( * ) Notice: Subject to any disclaimer, the term of this patent is extended or adjusted under 35 U.S.C. 154(b) by 196 days.

(21) Appl. No.: 14/278,362

(22) Filed: May 15, 2014

(65) Prior Publication Data

US 2015/0311021 A1    Oct. 29, 2015

Related U.S. Application Data

(63) Continuation-in-part of application No. 14/262,188, filed on Apr. 25, 2014.

(51) Int. Cl.
*H01H 57/00*    (2006.01)
*H01H 59/00*    (2006.01)
(Continued)

(52) U.S. Cl.
CPC ......... *H01H 59/0009* (2013.01); *B81B 7/007* (2013.01); *B81C 1/00341* (2013.01); *H01H 1/0036* (2013.01); *H01H 2001/0084* (2013.01)

(58) Field of Classification Search
CPC ............. H01H 57/00; H01H 2037/008; H01H 2205/00; H01H 2205/002; H01H 2205/004; H01H 2205/006
(Continued)

(56) References Cited

U.S. PATENT DOCUMENTS

| 4,030,943 A | 6/1977 | Lee et al. ............... 148/1.5 |
| 6,046,659 A | 4/2000 | Loo et al. ............... 333/262 |

(Continued)

FOREIGN PATENT DOCUMENTS

| EP | 0 255 911 | 2/1988 | .......... H01L 23/52 |
| WO | WO 2009/147600 | 12/2009 | .......... H01H 59/00 |

OTHER PUBLICATIONS

Maciel et al. "High-Reliability MEMS Switches for Wireless Applications," presented at 2010 iMAPS New England—37th Symposium & Expo—Boxborough, MA, 26 pages, May 4, 2010.

*Primary Examiner* — Renee Luebke
*Assistant Examiner* — Anthony R. Jimenez
(74) *Attorney, Agent, or Firm* — Sunstein Kann Murphy & Timbers LLP

(57) ABSTRACT

A MEMS switch has a base formed from a substrate with a top surface and an insulator layer formed on at least a portion of the top surface. Bonding material secures a cap to the base to form an interior chamber. The cap effectively forms an exterior region of the base that is exterior to the interior chamber. The MEMS switch also has a movable member (in the interior chamber) having a member contact portion, an internal contact (also in the interior chamber), and an exterior contact at the exterior region of the base. The contact portion of the movable member is configured to alternatively contact the interior contact. A conductor at least partially within the insulator layer electrically connects the interior contact and the exterior contact. The conductor is spaced from and electrically isolated from the bonding material securing the cap to the base.

35 Claims, 5 Drawing Sheets

(51) Int. Cl.
*B81B 7/00* (2006.01)
*B81C 1/00* (2006.01)
*H01H 1/00* (2006.01)

(58) Field of Classification Search
USPC ........ 200/181, 239, 238, 600; 333/236, 239, 333/243, 244, 245, 248, 262; 148/1.5; 361/233, 278
See application file for complete search history.

(56) References Cited

U.S. PATENT DOCUMENTS

| | | | |
|---|---|---|---|
| 6,115,231 A | 9/2000 | Shirakawa | 361/233 |
| 6,153,839 A | 11/2000 | Zavracky et al. | 200/181 |
| 6,377,438 B1 | 4/2002 | Deane et al. | 361/278 |
| 6,384,353 B1 * | 5/2002 | Huang | B81B 7/007 200/181 |
| 6,853,072 B2 | 2/2005 | Asano et al. | 257/728 |
| 7,101,724 B2 * | 9/2006 | Chou | B81C 1/00611 216/2 |
| 7,943,411 B2 | 5/2011 | Martin et al. | 438/50 |
| 2010/0320606 A1 | 12/2010 | Jain et al. | 257/751 |
| 2011/0147861 A1 | 6/2011 | Steeneken et al. | 257/415 |
| 2011/0315526 A1 * | 12/2011 | Jahnes | B81C 1/00476 200/181 |
| 2013/0140155 A1 | 6/2013 | Urvas et al. | 200/181 |

\* cited by examiner

MEMS SWTICH WITH INTERNAL CONDUCTIVE PATH

PRIORITY

This patent application is a continuation-in-part of U.S. patent application Ser. No. 14/262,188, filed Apr. 25, 2014, entitled, "MEMS SWITCH," and naming Padraig L. Fitzgerald, Jo-ey Wong, Raymond Goggin, Bernard Stenson, Paul Lambkin, and Mark Schirmer as inventors, the disclosure of which is incorporated herein, in its entirety, by reference.

FIELD OF THE INVENTION

The invention generally relates to MEMS switches and, more particularly, the invention relates to improving current flow through MEMS switches.

BACKGROUND OF THE INVENTION

A wide variety of devices use MEMS switches to selectively transmit current between two points. To that end, MEMS switches often include movable microstructure, such as a cantilevered arm, that is selectively brought into contact with an adjacent conductor. An actuation electrode (or other actuation mechanism) can apply a force, such as an attractive electrostatic force, to the cantilevered arm, urging the arm toward the adjacent conductor. Contact between the arm and the adjacent conductor closes a circuit, permitting current to flow across the switch between the two desired points. Conversely, when the arm and adjacent conductor do not contact, the circuit is open, thus preventing current flow.

The movable microstructure generally must be protected from the environment. If not, then environmental contaminants can severely damage the fragile microstructure, rendering the switch inoperable. Accordingly, MEMS switch microstructure typically is encapsulated within a wafer-level package, such as a cap, to protect the fragile microstructure. Undesirably, caps can increase the risk of a short circuit from the intended closed circuit.

SUMMARY OF VARIOUS EMBODIMENTS

In accordance with one embodiment of the invention, a MEMS switch has a base formed from a substrate with a top surface, and an insulator layer formed on at least a portion of the top surface. Bonding material secures the cap to the base to form an interior chamber. The cap effectively forms an exterior region of the base that is exterior to the interior chamber. The MEMS switch also has a movable member (in the interior chamber) having a member contact portion, an internal contact (also in the interior chamber), and an exterior contact at the exterior region of the base. The contact portion of the movable member is configured to alternatively contact the interior contact. A conductor at least partially within the insulator layer electrically connects the interior contact and the exterior contact. The conductor is spaced from and electrically isolated from the bonding material securing the cap to the substrate.

The switch has some structure to move the movable member. For example, the switch may have an actuation electrode configured to electrostatically control movement of the movable member. The movable member may take on a number of configurations. Among other things, the movable member may be in the form of a cantilever.

The insulator layer illustratively is between the conductor and the bonding material. Accordingly, the insulator layer electrically isolates the conductor from the bonding material. Among other properties, the bonding material may include an electrically insulating material or an electrically conductive material. To protect the interior chamber from the environment, the bonding material may hermetically seal the interior chamber.

The MEMS switch also may have a conductive path extending from the conductor to the interior chamber. This conductive path simply may include one or more of spaced apart vias. In addition, the conductor may have a generally planar portion extending generally parallel with the top surface of the substrate. This exemplary generally planar portion may be positioned within the insulator and spaced between about 0.5 to 3 microns from the interior chamber.

In accordance with another embodiment, a MEMS switch has a substrate with a top surface, an insulator layer formed on at least a portion of the top surface of the substrate to form a base. Bonding material secures a cap to the base to form an interior chamber. The MEMS switch also has a movable member with a member contact portion, and an interior contact, both within the interior chamber. The member contact portion is configured to alternatively contact the interior contact. A conductor at least partially within the insulator layer has a generally planar portion and at least one via extending from the generally planar portion. One or more of the at least one via(s) electrically contact the interior contact. The generally planar portion preferably is substantially completely encapsulated by the insulator layer and the one or more via(s), and the insulator layer electrically isolates the generally planar portion from the bonding material.

In accordance with other embodiments, a method of producing a MEMS switch forms, on a substrate, an insulator layer containing a completely encapsulated interior conductor. The substrate and insulator layer at least in part form a base. The method then removes a portion of the insulator layer to form a channel that exposes the interior conductor, and forms a conductive path through the channel to electrically connect with the interior conductor. The method also forms switch microstructure that is movable and configured to alternatively electrically connect with the interior conductor through the conductive path. To protect the microstructure, the method uses bonding material to secure a cap to the base to form an interior chamber containing the switch microstructure. The interior conductor is spaced from and electrically isolated from the bonding material securing the cap to the base.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a MEMS switch within a wafer level package more efficiently delivers signals between its internal movable member and exterior pads while at the same time mitigating short circuits to its cap. To that end, the MEMS switch is formed on a die with an interior conductor electrically connected between the movable member and external pads. One or more vias extending from the surface of the device to the interior conductor reduces signal resistance, thus improving efficiency. Moreover, insulating material between the interior conductor and bonding material coupling the cap to the switch die mitigates the short circuits to the cap through the bonding material. Details of illustrative embodiments are discussed below.

Figure 1:
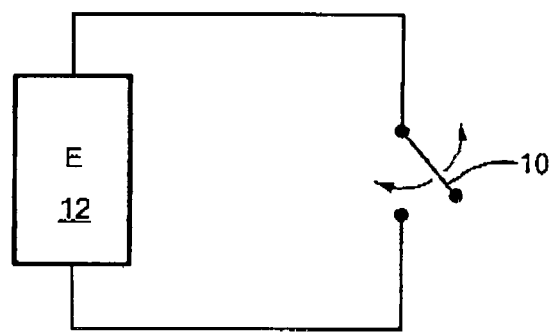
FIG. 1 schematically shows a circuit that may incorporate a switch configured in accordance with illustrative embodiments of the invention.

FIG. 1 schematically shows a circuit that may use a MEMS switch 10 configured in accordance with illustrative embodiments of the invention. Indeed, this figure shows a very simplified circuit in which the MEMS switch 10 may open and close a connection with one or more additional circuit elements 12. Those circuit elements are schematically represented by a box 12 both in parallel and in series with the switch 10. When the switch 10 is closed, electronic signals my flow between the circuit element(s) 12 and the switch 10. Conversely, when the switch 10 is open, current cannot flow through that portion of the circuit.

Of course, as known by those skilled in the art, MEMS switches are used in numerous different applications, in series, and parallel, in tandem, and in many other ways that are beyond the scope of this disclosure. Accordingly, the configuration shown in FIG. 1 is merely shown to describe the most basic function of a switch.

Figure 2:
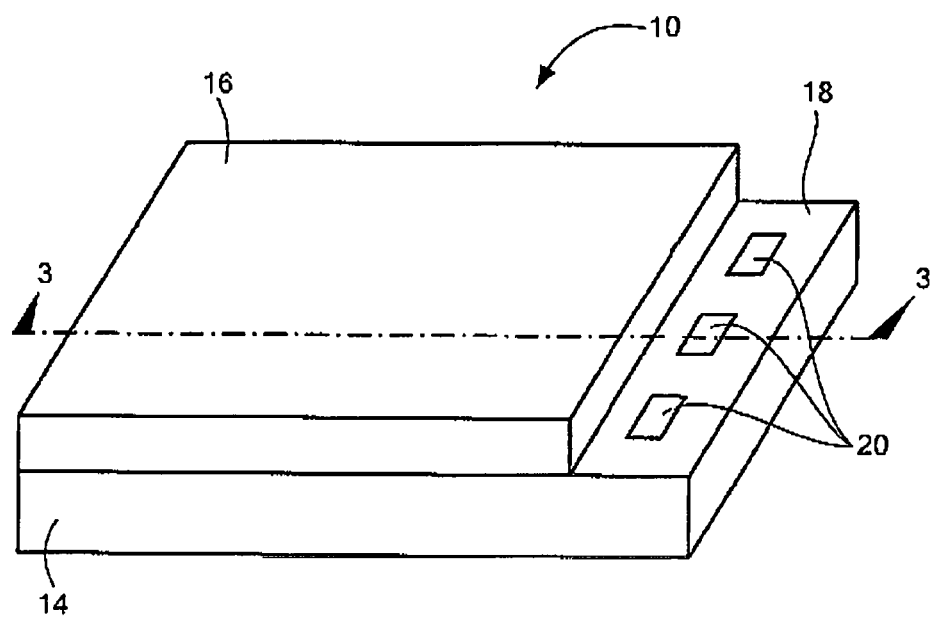
FIG. 2 schematically shows a perspective view of a MEMS switch configured in accordance with illustrative embodiments of the invention.

FIG. 2 schematically shows a perspective view of a MEMS switch device (also referred to simply as "MEMS switch 10") configured in accordance with illustrative embodiments of the invention. As noted above, the MEMS switch 10 is considered to have a wafer-level package. Accordingly, the MEMS switch 10 has a base portion (a die referred to simply as "base 14") containing MEMS microstructure and electrical interconnects (shown in FIG. 3 and other subsequent figures), and a cap 16 bonded to the base 14.

In the configuration shown, the cap 16 does not extend fully across the base 14. Instead, the cap 16 leaves a portion of the base 14 exposed to provide access to certain base components. In this case, the cap 16 exposes a narrow, exterior shelf 18 of the base 14 having a plurality of exterior pads 20. A circuit designer therefore may electronically access the internal components through these pads 20.

Figure 3:
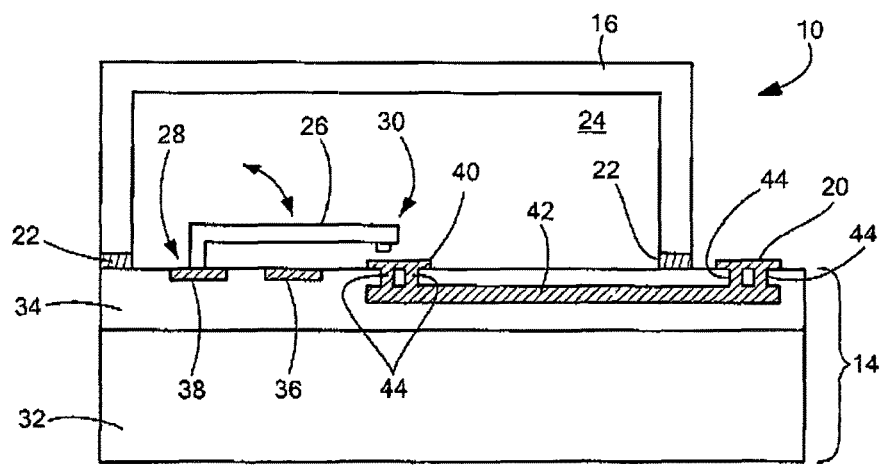
FIG. 3 schematically shows a cross-sectional view of the MEMS switch of FIG. 2 as viewed across line 3-3 of FIG. 2.

FIG. 3 shows interior details of the MEMS switch 10 of FIG. 2. Specifically, FIG. 3 schematically shows a cross-sectional view of the MEMS switch 10 of FIG. 2 as viewed across line 3-3 of FIG. 2. This figure more clearly shows the cap 16, its bonded connection with the base 14, and components protected by that cap 16. More specifically, illustrative embodiments use an insulating bonding material 22 to secure the cap 16 to the base 14. Among other things, the bonding material 22 may include conventional seal glass that directly bonds with the top surface of the base 14.

Due to the nature of the interior electrical interconnect structure (discussed below) and the base 14, some embodiments may bond the cap 16 with the base 14 using a conductive material, such as a metal or a metal alloy. For example, some of those embodiments may use aluminum, germanium, or an aluminum-germanium alloy, such as that disclosed by U.S. Pat. No. 7,943,411, owned by Analog Devices, Inc. of Norwood Mass., the disclosure of which is incorporated herein, in its entirety, by reference. Other embodiments nevertheless may use other types of bonding material 22. Accordingly, discussion of a specific type of bonding material 22 is not intended to limit many embodiments of the invention.

The cap 16 forms an interior chamber 24 with the base 14, protectively containing the operating microstructure and much of the circuitry. Specifically, the microstructure primarily includes a movable member 26 that, like other switches and noted above, alternatively opens and closes an electrical circuit. In this case, the switch microstructure is configured as a cantilevered beam or arm (also identified using reference number "26") having a body at least partially suspended above the base 14. To make an electrical connection between two points, the body has a fixed end 28 (one point) directly connected to a conductor on/in the base 14, and a movable free end 30 (the second point) configured to selectively make electrical and mechanical contact with another conductor on/in the base 14.

To serve as a highly conductive path, the cantilevered arm 26 may be formed primarily from a relatively soft material, such as gold. Gold, however, is a relatively soft metal that can be easily damaged. Consequently, if left untreated or not reinforced, the movable free end 30 of the cantilevered arm 26 may not be capable of withstanding repeated contact with its underlying contact pad 40, which can be relatively hard (e.g., the contact pad 40 may be formed from a metal having an oxide that is conductive, such as ruthenium). To that end, illustrative embodiments may form a hard outer layer to the leading edge of the free end 30 of the cantilevered arm 26. For example, the movable free end 30 may have a layer of ruthenium (identified by reference number 31 in FIG. 5B) on the exterior surface of its free end 30.

The base 14 has a network of electrical interconnects, electrodes, and pads to control current flow across the die, and to control movement of the cantilevered arm 26. These components are formed on or in conjunction with an insulation layer 34 of the base 14. Specifically, the base 14 is formed from a plurality of materials deposited and etched in accordance with conventional micromachining processes. To that end, the base 14 includes a relatively thick substrate 32 having a generally planar top surface, and the above noted insulation layer 34 formed on the top surface of the substrate 32. To provide a usable interconnect and actuation system having small isolated transmission lines, the electrical interconnects and pads are formed on and/or in the insulation layer 34.

To those ends, the base 14 has a control electrode 36 integrated with its insulation layer 34 to selectively move the cantilevered arm 26. The control electrode 36 preferably is directly beneath the cantilevered arm 26 to deliver the most effective actuation signal. In illustrative embodiments, this control electrode 36 delivers an electrostatic signals that either urges the cantilevered arm 26 downwardly toward a receiving contact pad 40 (discussed below) on the base 14, or upwardly away from the receiving contact pad 40 on the base 14. For example, the electrostatic signals/forces may attract the cantilevered arm 26 when closing the circuit, and conversely force the cantilevered arm 26 upwardly, away from the base 14 to open the circuit. Rather than affirmatively applying an electrostatic force to repel the cantilevered arm 26, some embodiments simply rely on the resiliency of the cantilevered arm 26 to urge it away from the base 14. In that latter case, the control electrode 36 may be configured to generate an attractive force only.

Control circuitry delivers appropriate signals for moving the cantilevered arm 26, thus selectively opening and closing the switch 10. Although not shown in the figures, some embodiments physically locate that circuitry on the same die/base 14 as the microstructure. Other embodiments, however, locate that circuitry on a separate die, such as an application-specific integrated circuit (ASIC). In the latter case, some higher-level system-wide interconnect electrically couples the ASIC die with the die forming the switch 10. For example, both dies may be mounted on a printed circuit board and electrically connected by means of conventional wirebonds or other means.

The fixed end 28 of the cantilevered arm 26 directly contacts an input line 38 within the insulation layer 34. In a corresponding manner, the movable free end 30 of the cantilevered arm 26 alternatively contacts a fixed conductive surface of the base 14, such as the prior noted contact pad 40, that is a directly electrically connected, through a relatively highly conductive interior conductor 42 within the insulator layer, with one or more of the plurality of exterior pads 20 on the exterior shelf 18 of the base 14.

To make this connection to the exterior pads 20, however, the inventors first ran a conductive line along the surface of the base 14, underneath and in contact with the bonding material 22 coupling the cap 16 with the base 14. The inventors noticed, however, that the signal through the die was being attenuated by some unknown part of the system. The inventors first discounted the possibility of short circuits with the seal glass bonding material 22 because such material is well known to be an effective insulator. After further testing, however, the inventors discovered that the seal glass indeed was the problem. Specifically, the inventors discovered that material from the conductive line was somehow penetrating into the seal glass layer, providing it with a higher conductivity than expected. This conductive material, which is a contaminant to the seal glass, was discovered to have undesirably created a signal path to the cap 16.

The inventors responded to this new discovery by insulating the signal line (i.e., the signal line between the contact pad 40 that receives the movable free end 30 of the cantilevered arm 26 and the exterior pads 20) from the seal glass coupling the cap 16 to the base 14. Tests of this new design favorably showed significantly improved results, substantially mitigating or eliminating the signal loss detected on the prior designs.

To those ends, illustrative embodiments form the noted interior conductor 42 within the insulation layer 34 of the base 14—spaced from the top surface of the base 14. Accordingly, this interior conductor 42 is spaced from and not in contact with the seal glass. To that end, the interior conductor 42 preferably has a generally planar top surface from which, as noted above, one or more conductive paths extend to the surface of the base 14.

More specifically, the base 14 has one or more conductive vias 44 extending from 1) the contact pad 40 under the free end 30 of the cantilevered arm 26 to 2) the interior conductor 42. While some embodiments of the contact pad 40 may be thin and have a relatively high resistance, the vias 44 preferably have a higher conductivity and are very short, thus reducing the resistance between the end of the cantilevered arm 26 and the interior conductor 42. For example, the vias 44 may have a length of about 0.5 to 3 microns, or about 1 to 2 microns, thus providing a short path to the more highly conductive interior conductor 42. In a manner similar to the contact pad 40, the exterior pads 20 on the exterior shelf 18 of the base 14 also can connect with the same interior conductor 42 through one or more vias 44

Both the input line 38 at the fixed end 28 of the cantilevered arm 26, as well as the control electrode 36 that controls movement of the cantilevered arm 26, can have a similar via arrangement to other interior conductors 42. Accordingly, although such an arrangement is not shown in FIG. 3 for those portions of the die circuit, those skilled in the art can adapt various embodiments to have that configuration. In fact, these different interior conductors 42 of the base 14 can be configured differently from each other. For example, they may be oriented in different directions with respect to each other (e.g., orthogonally or in many directions), or in different levels of the insulation layer 34.

Figure 4:
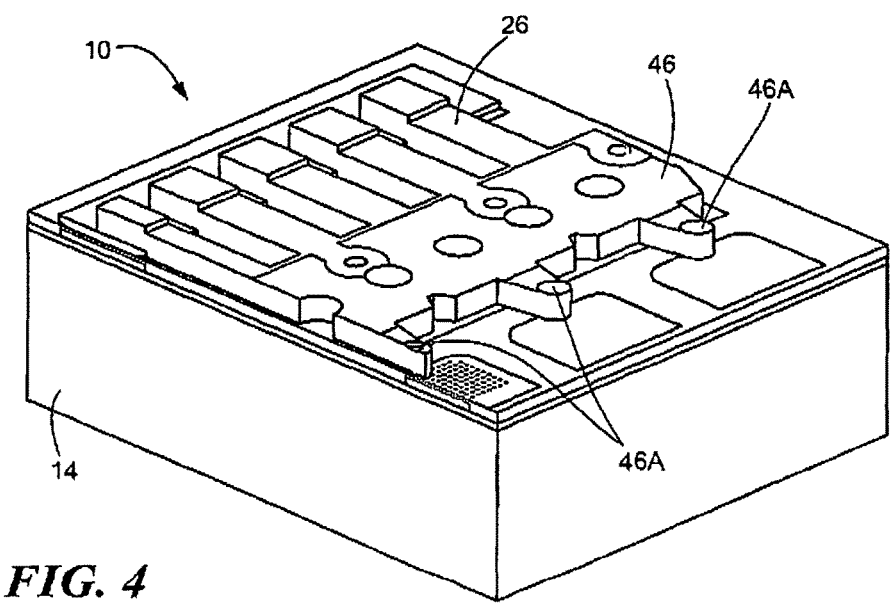
FIG. 4 schematically shows a perspective view of an alternative embodiment of the MEMS switch shown in FIG. 2.

FIG. 4 schematically shows a perspective view of one implementation of the base 14 shown in FIGS. 2 and 3 (with its cap 16 removed) in which the base 14 has multiple cantilevered arms 26. Specifically, the movable end 30 of each cantilevered arm 26 is coupled to a common member 46 that has three different portions 46A that alternatively contact the base 14. Specifically, each of the three different portions 46A alternatively connects with one contact pad 40 of the base 14. Accordingly, this implementation may have three different interior conductors 42 and other similar components to those described with regard to FIG. 3. Of course, various embodiments apply to any of a number of different designs having one or more cantilevered arms 26 of different designs. For example, the design of FIG. 4 could have three separate and electrically isolated cantilevered arms 26 that alternatively contact three electrically isolated contact pads 40.

In fact, those skilled in the art can apply principles of various embodiments to other types of movable members. For example, rather than using a cantilevered arm 26, some embodiments may have a simple movable member 26 that moves substantially entirely up and down, relative to the base 14 (in the Z direction). As another example, some embodiments may have a movable member 26 that moves in a direction that is generally parallel to the base 14. Appropriate contacts are positioned to make the required electrical connections of such embodiments. Indeed, those skilled in the art may use any of a number of other movable members 26 and still be within the spirit and scope of various embodiments of the invention.

Figure 5A:
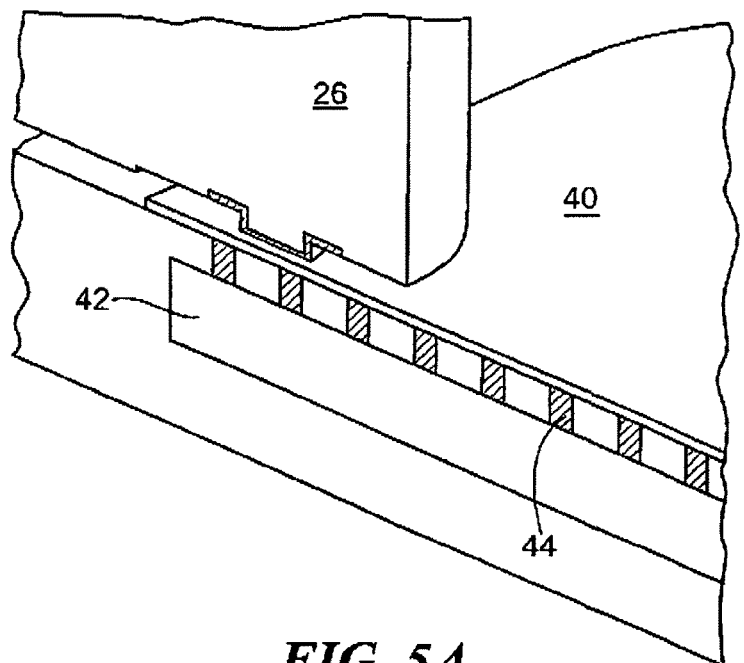
FIGS. 5A and 5B schematically show perspective and direct cross-sectional views of a portion of the MEMS switch of FIG. 4.
Figure 5B:
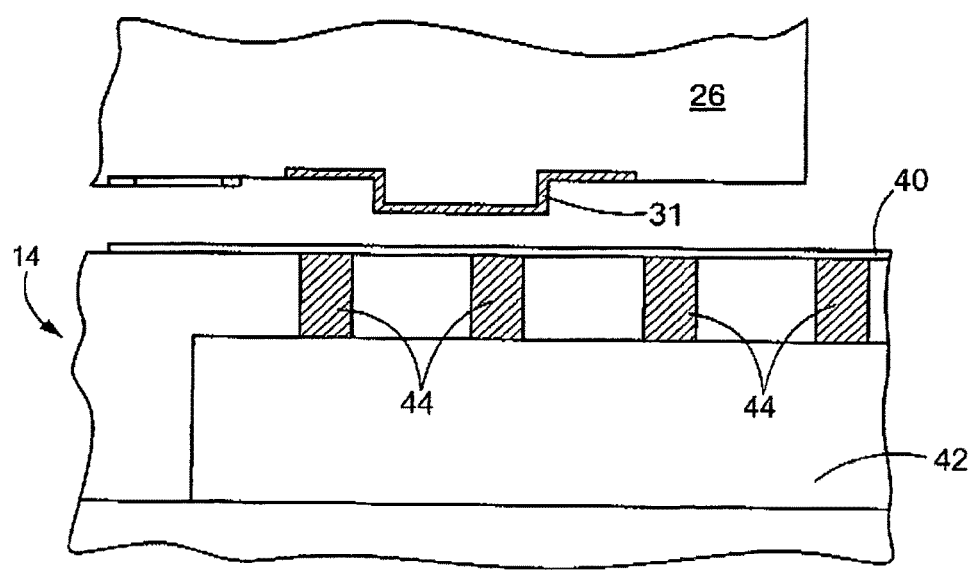
Figure 6:
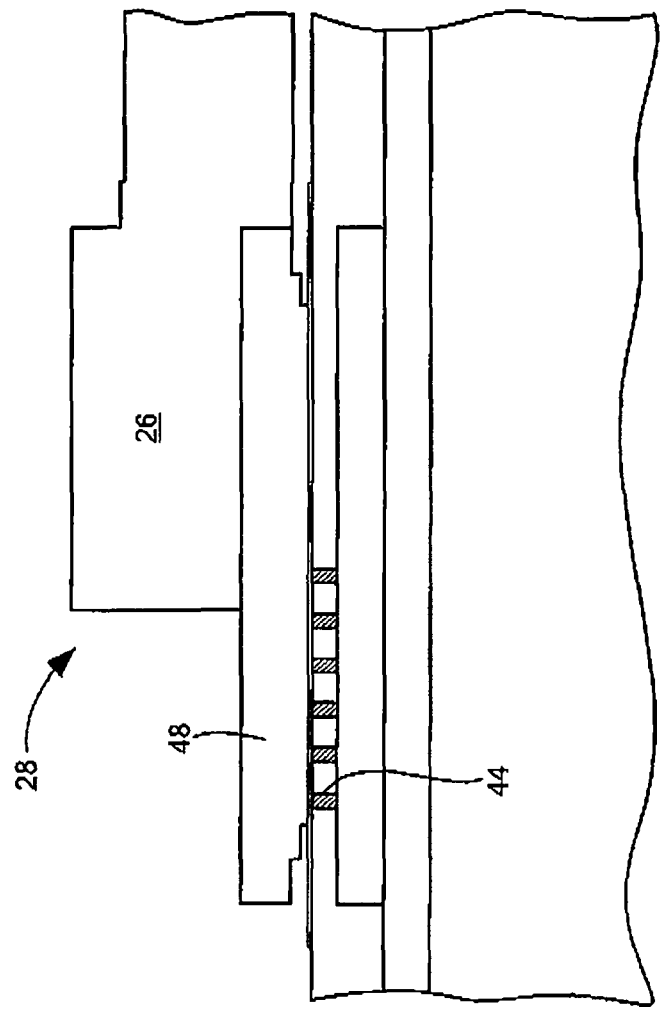
FIG. 6 schematically shows a cross-sectional view of the connected portion of a cantilever MEMS switch in accordance with one embodiment of the invention.

FIGS. 5A and 5B respectively show schematic close-up perspective and side cross-sectional views of the movable free end 30 of one embodiment of the cantilevered arm 26 and base 14. As shown, the base 14 has a plurality of spaced apart vias 44 extending from the contact pad 40 to the interior conductor 42. These multiple short paths should improve conductivity and the ultimate signal quality of the switch 10. In a similar manner, FIG. 6 schematically shows an embodiment in which a plurality of vias 44 extend from a conductive element 48 at the fixed end 28 of the cantilevered arm 26 and its underlying interior conductor.

Figure 7:
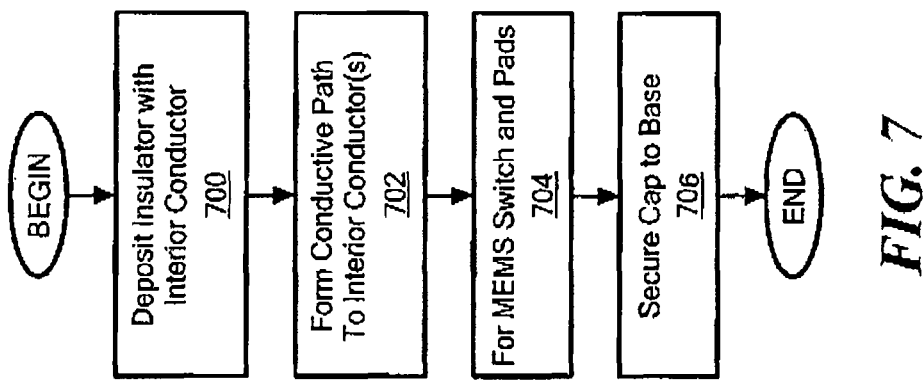
FIG. 7 shows a process of forming the MEMS switch of FIG. 2 in accordance with illustrative embodiments of the invention.

FIG. 7 shows a process of forming the switch 10 of FIGS. 2 and 3 in accordance with illustrative embodiments of the invention. It should be noted that this process is a simplified summary of the overall process of forming the switch 10 and thus, does not include a number of other steps that may be included, such as testing and preparation of certain equipment. Moreover, some steps may be performed in a different order or, in some instances, omitted.

In general, the process of FIG. 7 preferably forms a plurality of microchips or dies (e.g., the capped switch die of FIGS. 2 and 3) in parallel by simultaneously fabricating a two dimensional array of individual switch devices (e.g., MEMS devices) from a device wafer, and sealing each of those switch devices with caps formed from a single cap wafer. Some embodiments, however, process a single device at a time and thus, do not employ these noted batch processes.

The process of FIG. 7 begins at step 700, which begins to form the base 14 by depositing insulator material onto the substrate 32 and forming the interior conductor 42. To that end, the process first deposits a substantially solid layer of oxide or other insulator onto the substrate 32 (e.g., a wafer if using a batch processes). Among other things, the substrate 32 may be formed from a high resistance single crystal silicon, while the insulator may be formed from alumina. Again, it should be noted that the materials described in this process are not intended to limit all embodiments.

This step then deposits a relatively highly conductive material on selected portions of the insulator layer to form the interior conductor 42. For example, this step may use surface deposition techniques and masks or similar micromachining techniques to remove selected portions of the insulator layer and to deposit conductive material. Among other things, the interior conductor 42 may be formed from gold or other conductive material. This step then deposits an additional layer of oxide over the current oxide and the newly formed interior conductor 42, which forms a substantially planar top surface for the base 14.

At this point, the interior conductor 42 is completely encapsulated within the insulation layer 34—considered to be "buried" within the insulator. Some skilled in the art may call the interior conductor 42 a "buried conductor." Of course, if it is not connected to anything, the interior conductor 42 will be useless. Accordingly, the process continues to step 702, which forms a conductive path to the interior conductor 42 within the insulator material. To that end, the process may apply a mask to the surface of the insulator with openings directly over selected portions of the interior conductor 42. Conventional fabrication processes may apply etchant through the mask openings to remove some of the oxide, thus forming channels from the top surface of the base 14 to the interior conductor 42. Now that the interior conductor 42 is exposed, this step then applies metal or other conductive material to the top of the base 14 and through these etched holes to form vias 44 and pads that are exposed to the top surface of the base 14. Although not necessary, this conductive metal preferably is the same metal or material that forms the interior conductor 42. In other embodiments, the vias 44 are formed at least in part from tungsten.

After forming the system of electrical interconnects and surface pads, the process moves to step 704, which forms the MEMS microstructure; primarily, the cantilevered arm 26. As known by those skilled in the art, this may involve widely known additive and subtractive micromachining processes, using sacrificial layers and other related techniques. In illustrative embodiments, the cantilevered arm 26 is formed from a highly conductive material, such as gold. In other embodiments, however, the conductive materials may be formed from other metals, or a semiconductor, such as highly doped polysilicon.

The process concludes at step 706, which secures the cap 16 to the base 14. In illustrative embodiments, the cap 16 is formed from a portion of a bulk silicon wafer having an etched out recess that in-part forms the interior chamber 24. Other embodiments, however, may form the cap 16 from multiple components (e.g., a wall portion and a top portion).

To that end, the process forms a ring of bonding material 22, such as seal glass, on the surface of the base 14, and presses the cap 16 in place against the seal glass to form the protective interior chamber 24 of the switch 10. Some embodiments perform this capping process in an environment having a buffer gas, thus providing an internal atmosphere of gas within the switch 10 at a prescribed pressure. In that case, the cap 16 preferably forms a hermetic seal with the base 14. Other embodiments, however, may form the interior chamber 24 at atmosphere without a gas, or under vacuum.

As noted above, this process may be performed for a single switch 10 in die form, or for a plurality of switch dies 10 in a bulk process. If completed in a bulk process, then conventional facing processes singulate/dice the devices to simultaneously produce a plurality of MEMS switches 10.

Illustrative embodiments described above therefore permit efficient signal transmission without competing against a short circuit to the bonding material 22 and cap 16. Among other benefits, such embodiments are expected to reduce the resistance in the region where the cantilevered arm 26 makes contact, increase power handling, and reduce loss. In other words, the switch 10 should deliver improved performance at a lower power.

Figure 8:
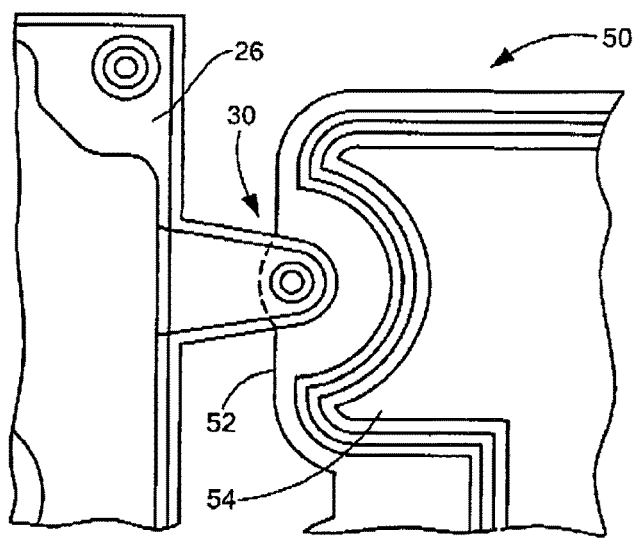
FIG. 8 shows a plan view of another MEMS switch configured in accordance with another embodiment of the invention.
Figure 9:
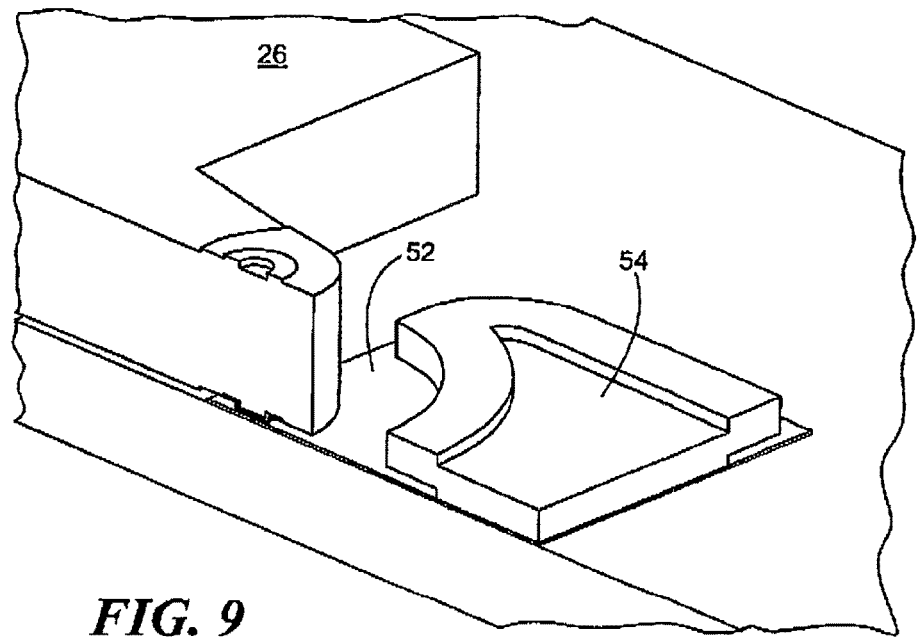
FIG. 9 schematically shows a perspective cross-sectional view of the MEMS switch of FIG. 8.

Other embodiments may provide a similar benefit. FIGS. 8 and 9 show one such embodiment, which does not necessarily use an interior conductor 42. Instead, this embodiment uses the same cantilever arm structure, but different interconnect circuitry. Specifically, this embodiment replaces the contact pad 40 of the other embodiment with a surface exposed two-level conductor 50. As shown, the movable free end 30 of the cantilevered arm 26 is configured to alternatively contact a first portion 52 of the two-level conductor. As best shown in FIG. 9, this first portion 52 is relatively thin and thus, has a relatively high resistance. Signals from that first portion 52 traverse along its body to contact a second portion 54, which is thicker and thus, has a lower resistance—preferably much lower than the resistance of the first portion 52. Die processing constraints limit the distance of the point of contact of the cantilevered arm 26 to the second portion 54.

The inventors recognized that current or signal generally travels the lowest resistance and shortest path to a destination. In this case, the starting point is the point of contact, and the destination is the second portion 54. As such, the higher resistance first portion 52 preferably physically contacts the lower resistance second portion 54 in a manner that forms a plurality of different paths from the point of contact with the cantilevered arm 26 to the second portion 54. FIG. 8 shows this best.

More particularly, the second portion 54 preferably is shaped to have a low radius, substantially constant curvature facing the point of contact of the cantilevered arm 26. This configuration theoretically provides an infinite number of substantially equidistant current paths from the point of contact to the lower resistance second portion 54. This curved region can be a reasonable distance from the point of contact, such as 5 to 15 microns away. During testing, this configuration was demonstrated to improve signal performance over a similar design that had no such arcuate configuration.

Other implementations may not form the arcuate portion with a substantially constant radius. Instead, some embodiments may vary the second portion radius, or even form edges with fewer leading regions that are close to the point of contact. For example, the region of the second portion 54 that initially receives the signal can have conductive lines extending toward the point of contact, or have a polygonal shape.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS switch comprising:
    a substrate having a top surface;
    an insulator layer on at least a portion of the top surface of the substrate, the insulator layer and substrate forming a base;
    a cap;
    bonding material securing the cap to the base to form an interior chamber, the cap forming an exterior region of the base that is exterior to the interior chamber;
    a movable member having a member contact portion;
    an interior contact, the member contact portion being configured to alternatively contact the interior contact, the movable member and interior contact being within the interior chamber;
    an exterior contact at the exterior region of the base; and
    a conductor at least partially within the insulator layer, the conductor electrically connecting the interior contact and the exterior contact, the conductor being spaced from and electrically isolated from the bonding material securing the cap to the base.

2. The MEMS switch as defined by claim 1 wherein the movable member comprises a cantilever.

3. The MEMS switch as defined by claim 1 wherein the bonding material comprises an electrically insulating material.

4. The MEMS switch as defined by claim 1 further comprising a conductive path extending from the conductor to the interior contact.

5. The MEMS switch as defined by claim 4 wherein the conductive path comprises a plurality of spaced apart vias.

6. The MEMS switch as defined by claim 1 wherein the insulator layer is between the conductor and the bonding material, the insulator layer electrically isolating the conductor from the bonding material.

7. The MEMS switch as defined by claim 1 wherein the bonding material hermetically seals the interior chamber.

8. The MEMS switch as defined by claim 1 comprising an actuation electrode configured to electrostatically control movement of the movable member.

9. The MEMS switch as defined by claim 1 wherein the conductor has a generally planar portion extending generally parallel with the top surface of the substrate, the generally planar portion being within the insulator layer and spaced between about 0.5 to 3 microns from the interior chamber.

10. A MEMS switch comprising:
    a substrate having a top surface;
    an insulator layer on at least a portion of the top surface of the substrate, the insulator layer and substrate forming a base;
    a cap;
    bonding material securing the cap to the base to form an interior chamber;
    a movable member having a member contact portion;
    an interior contact, the member contact portion being configured to alternatively contact the interior contact, the movable member and interior contact being within the interior chamber; and
    a conductor at least partially within the insulator layer, the conductor having a generally planar portion and at least one via extending from the generally planar portion, one or more of the at least one via(s) electrically contacting the interior contact, the generally planar portion being substantially completely encapsulated by the insulator layer and the one or more via(s), the insulator layer electrically isolating the generally planar portion from the bonding material.

11. The MEMS switch as defined by claim 10 wherein the generally planar portion is spaced between about 0.5 and 3.0 microns from the interior chamber.

12. The MEMS switch as defined by claim 10 wherein the bonding material comprises an insulator material or a conductive material.

13. The MEMS switch as defined by claim 10 wherein the cap is electrically isolated from the base.

14. The MEMS switch as defined by claim 10 wherein the movable member comprises a cantilever.

15. The MEMS switch as defined by claim 10 wherein the bonding material secures the cap with material formed on the top surface of the substrate.

16. The MEMS switch as defined by claim 10 wherein the cap forms an exterior region of the base that is exterior to the interior chamber, the exterior region having an exterior contact, the conductive member electrically connecting the exterior contact with the interior contact.

17. A method of producing a MEMS switch, the method comprising:
    forming an insulator layer on a substrate to produce a base, the insulator layer containing a completely encapsulated interior conductor;
    removing a portion of the insulator layer after forming the insulator layer, forming a channel to expose the interior conductor;
    forming a conductive path through the channel to electrically connect with the interior conductor;
    forming, on the base, a switch microstructure that is movable and configured to alternatively electrically connect with the interior conductor through the conductive path; and
    using a bonding material to secure a cap to the base, the cap and base forming an interior chamber containing the switch microstructure, the interior conductor being spaced from and electrically isolated from the bonding material securing the cap to the base.

18. The method as defined by claim 17 further comprising forming an exterior contact on the base, the exterior contact being exterior to the interior chamber and electrically connected with the interior conductor.

19. The method as defined by claim 17 wherein the bonding material comprises seal glass.

20. The method as defined by claim 17 further comprising forming an internal contact that is electrically connected with the conductive path, the internal contact being formed from a metal material with the property of having a conductive oxide when oxidized.

21. The method as defined by claim 17 wherein forming the insulator layer comprises:
   forming a conductor on a portion of a first insulator layer, and
   depositing a second insulator layer on the first insulator layer and conductor to form the encapsulated interior conductor.

22. The MEMS switch as defined by claim 1 further comprising a hard conductive outer layer on the member contact portion.

23. The MEMS switch as defined by claim 1 wherein the interior contact comprises a two-level conductor having a first portion for contact with the member contact portion and a second portion electrically coupled to the first portion and to the conductor, the second portion having a lower resistance than the first portion.

24. The MEMS switch as defined by claim 23 wherein the second portion comprises a concave surface facing a point of contact by the member contact portion.

25. The MEMS switch as defined by claim 24 wherein tie concave surface has a curvature with a substantially constant radius.

26. The MEMS switch as defined by claim 24 wherein the concave surface has a curvature with a varying radius.

27. The MEMS switch as defined by claim 1 further comprising:
   a second exterior contact at the exterior region of the base; and
   a second conductor on or at least partially within the insulator layer, the second conductor electrically connecting the movable member and the second exterior contact, the second conductor being spaced from and electrically isolated from the bonding material securing the cap to the base.

28. The MEMS switch as defined by claim 27 further comprising a second conductive path extending from the second conductor to the movable member.

29. The MEMS switch as defined by claim 28, wherein tie second conductive path comprises a plurality of spaced apart vias.

30. The MEMS switch as defined by claim 28, wherein the movable member comprises a conductive element in contact with the second conductive path.

31. The MEMS switch as defined by claim 1 further comprising:
   a third exterior contact at the exterior region of the base;
   a control electrode under a portion of the movable member; and
   a third conductor on or at least partially within the insulator layer, the third conductor electrically connecting the control electrode and the third exterior contact, the third conductor being spaced from and electrically isolated from the bonding material securing the cap to the base.

32. The MEMS switch as defined by claim 1 wherein the movable member comprises:
   a plurality of cantilever arms; and
   a common member coupled to the plurality of cantilever arms, the common member including the member contact portion.

33. The MEMS switch as defined by claim 32 wherein the common member includes a plurality of member contact portions.

34. The MEMS switch as defined by claim 33 further comprising a plurality of interior contacts, wherein each member contact portion of the plurality of member contact portions is configured to alternatively contact a respective interior contact of the plurality of interior contacts.

35. The MEMS switch as defined by claim 34 further comprising a plurality of a conductors at least partially within the insulator layer, each conductor of the plurality of conductors electrically connecting a respective interior contact to an exterior contact, the conductors being spaced from and electrically isolated from the bonding material securing the cap to the base.

* * * * *